(12) United States Patent
Lifka et al.

(10) Patent No.: US 10,573,690 B2
(45) Date of Patent: Feb. 25, 2020

(54) METHOD FOR PRODUCING A RADIATION DETECTOR AND RADIATION DETECTOR

(71) Applicant: KONINKLIJKE PHILIPS N.V., Eindhoven (NL)

(72) Inventors: Herbert Lifka, Eindhoven (NL); Joanna Maria Elisabeth Baken, Eindhoven (NL); Reinder Coehoorn, Eindhoven (NL); Paulus Albertus Van Hal, Waalre (NL); Herfried Karl Wieczorek, Aachen (DE); Helga Hummel, Aacen (DE); Cornelis Reinder Ronda, Aachen (DE); Matthias Simon, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 139 days.

(21) Appl. No.: 15/760,645

(22) PCT Filed: Sep. 16, 2016

(86) PCT No.: PCT/EP2016/072065
§ 371 (c)(1),
(2) Date: Mar. 16, 2018

(87) PCT Pub. No.: WO2017/046390
PCT Pub. Date: Mar. 23, 2017

(65) Prior Publication Data
US 2018/0277608 A1  Sep. 27, 2018

(30) Foreign Application Priority Data
Sep. 17, 2015  (EP) .................... 15185586

(51) Int. Cl.
*H01L 51/00* (2006.01)
*H01L 27/30* (2006.01)
(Continued)

(52) U.S. Cl.
CPC .......... *H01L 27/308* (2013.01); *G01T 1/2018* (2013.01); *G01T 1/2023* (2013.01);
(Continued)

(58) Field of Classification Search
CPC ............. H01L 51/0003; H01L 51/4273; H01L 51/441
See application file for complete search history.

(56) References Cited

U.S. PATENT DOCUMENTS

| 5,132,541 A | 7/1992 | Conrads |
| 2004/0129922 A1 | 7/2004 | Shibuya |
| 2015/0249170 A1* | 9/2015 | Snaith ................. H01L 51/422 136/256 |

FOREIGN PATENT DOCUMENTS

| EP | 1258736 A1 | 11/2002 |
| EP | 1265065 B1 | 12/2014 |

OTHER PUBLICATIONS

Sutherland, Brandon R et al: "Perovskite Thin Films via Atomic Layer Deposition", Advanced Materials, vol. 27, No. 1, Jan. 30, 2015 (Jan. 30, 2015), pp. 53-58, XP55256543.
(Continued)

*Primary Examiner* — Douglas M Menz
(74) *Attorney, Agent, or Firm* — Larry Liberchuk

(57) ABSTRACT

The invention relates to a method for producing a radiation detector used to detect ionizing radiation including a first inorganic-organic halide Perovskite material (24) as a direct converter material and/or as a scintillator material in a detector layer and to a radiation detector comprising a detector layer (24) produced by means of the steps of the method. In order to provide an approach for producing a thick layer (e.g. above 10 μm) of Perovskite material suitable for a radiation detector, it is proposed to grow the material selectively on a seeding layer (23), yielding in a thick polycrystalline layer. One suitable seeding layer (23) to grow lead Perovskite material is made of a bromide Perovskite material.

15 Claims, 2 Drawing Sheets

(51) Int. Cl.
G01T 1/20 (2006.01)
G01T 1/202 (2006.01)
G01T 1/24 (2006.01)
H01L 51/42 (2006.01)
H01L 51/44 (2006.01)

(52) U.S. Cl.
CPC .......... *G01T 1/241* (2013.01); *H01L 51/0003* (2013.01); *H01L 51/4273* (2013.01); *H01L 51/441* (2013.01); *H01L 51/0077* (2013.01)

(56) References Cited

OTHER PUBLICATIONS

Julian Burschka et al: "Sequential Deposition as a Route to High-Performance Perovskite-Sensitized Solar Cells", Nature, vol. 499, No. 7458, Jul. 10, 2013 (Jul. 10, 2013), pp. 316-319, XP055131813.

Gill, Hardeep Singh et al., "Direct X-Ray Detection with Hybrid Solar Cells Based on Organolead Halide Perovskites" APS Bulletin, 2014, v 59 (1).

Dong, Qingfeng et al., "Electron-Hole Diffusion Lengths > 175 □m in Solution-Grown CH3NH3PbI3 Single Crystals", Scienexpress, 2015, pp. 1-8.

Kishimoto, S. et al., "A Fast X-Ray Detector Using a New Organic-Inorganic Perovskite Scintillator", available at http://pfwww.kek.jp/acr2008pdf/part_a/08ah8_3.pdf on Mar. 31, 2015.

Kishimoto, S. et al., "Fast Scintillation Detectors for High Energy X-Ray Region", Hyperfine Interact 2011; DOI 10.1007/s10751-011-0543-x.

Kasap, Safa et al., "Amorphous and Polycrystalline Photoconductors for Direct Conversion Flat Panel X-Ray Image Sensors", Sensors 2011, 11, 5112-5157 (2011).

Shibuya, K. et al., "Quantum Confinement for Large Light Output from Pure Semiconducting Scintillators", 2004—Applied Physics Letters.vol. 84.No. 22, May 31, 2004, pp. 4370-4372.

\* cited by examiner

METHOD FOR PRODUCING A RADIATION DETECTOR AND RADIATION DETECTOR

FIELD OF THE INVENTION

The invention relates to a method for producing a radiation detector for ionizing radiation including a first inorganic-organic halide Perovskite material as a direct converter material and/or as a scintillator material in a detector layer and to a radiation detector comprising a detector layer produced by means of the steps of the method.

BACKGROUND OF THE INVENTION

Scintillators are materials that absorb high energy radiation, such as $\alpha$-, $\beta$-, $\gamma$-rays, X-rays, neutrons or other high energetic particles, and convert that energy into bursts of visible photons. In detectors for the above mentioned radiation, these photons are then converted into electrical pulses by photo-detectors.

Alternatively the radiation is converted directly in a semiconductor which is sandwiched between two electrodes. In a detector the initially created electron-hole-pairs are separated by an externally applied electric field and the resulting electrical current sensed by an amplifier. Various materials for direct conversion detectors for X-ray radiation are described, for example, in "Amorphous and Polycrystalline Photoconductors for Direct Conversion Flat Panel X-Ray Image Sensors" by S. Kasap et al. (Sensors 2011, 11, 5112-5157 (2011)). U.S. Pat. No. 5,132,541 addresses applications in flat X-ray detectors.

Already for quite some time, inorganic-organic halide Perovskites have been investigated for several applications. One of them is scintillators, see, for example, "Quantum confinement for large light output from pure semiconducting scintillators" by K. Shibuya et al. (Applied Physics Letters, vol. 84, no. 22, p. 4370-4372). Such systems have also been investigated for EL-light-emission and photovoltaics (PV) with very high efficiencies, see, for example, "Organic-inorganic heterostructure electroluminescent device using a layered perovskite semiconductor $(C_6H_5C_2H_4NH_3)_2PbI_4$" by M. Era et al. (Appl. Phys. Lett. 65 (6), p. 676-678, August 1994) and "The light and shade of perovskite solar cells" by M. Grätzel (Nature Materials, Vol. 13, 2014, p. 838-842).

Perovskite materials are also known to act as a light emitter, see, for example, "Bright light-emitting diodes based on organometal halide perovskite" by Z.-K. Tan et al. (Nature Nanotechnology, vol. 9, p. 687-692, 2014).

EP 1 258 736 A1 relates to a radiation detection device for detecting ionizing beam discharges such as gamma rays, x-rays, electron beams, charged particle beams and neutral particle beams. Specifically, it relates to a radiation detection device which can measure radiations which exist for a very short time (of the order of subnanoseconds or less) from the appearance of photoemission to extinction.

It is an object of EP 1 258 736 A1 to provide a radiation detection device using a perovskite organic-inorganic hybrid compound as a scintillator, the formula of this compound being $(R^1-NR^{11}_3)_2MX_4$ or $(R^2=NR^{12}_2)_2MX_4$, or alternatively, $(NR^{13}3-R^3-NR^{13}_3)MX_4$ or $(NR^{14}_2=R^4=NR^{14}_2)MX_4$ (in the formula, $R^1$ is a monovalent hydrocarbon group which may contain a heterocyclic ring and may be substituted by halogen atoms, $R^2$ is a divalent hydrocarbon group which may contain a heterocyclic ring and may be substituted by halogen atoms, and may be cyclic, $R^3$ is a divalent hydrocarbon group which may contain a heterocyclic ring and may be substituted by halogen atoms, $R^4$ is a tetravalent hydrocarbon group which may contain a heterocyclic ring and may be substituted by halogen atoms, $R^{11}$-$R^{14}$ may be identical or different, and may be hydrogen atoms or alkyl groups having two or more atoms, M is a Group IVa metal, Eu, Cd, Cu, Fe, Mn or Pd, and X is a halogen atom). This radiation detection device can quantify the radiation amount of the detected radiation.

An interesting application of the inorganic-organic halide Perovskites are X-ray detectors. In order to fabricate an X-ray detector based on the inorganic-organic halide Perovskites, a comparatively thick layer of the Perovskite appears to be needed. Growing single crystals is known, however it is not yet known how to efficiently grow a thick (poly) crystalline layer on a substrate.

For spatial X-ray detection a structured set of separate detectors is required. This can be fabricated by structuring the bottom electrode, depositing a Perovskite layer and depositing a cathode on top. Apart from the bottom electrode structuring, the process is quite similar to the Perovskite-PV process. However, for PV only Perovskite layers of around 300 nm have to be deposited. This can be done by spin-coating or physical or chemical vapor deposition. For layers above 10 µm thick this is not possible and/or affordable.

SUMMARY OF THE INVENTION

It is an object of the present invention to provide an approach for producing a thick layer (e.g. above 10 µm) of Perovskite material suitable for a radiation detector for ionizing radiation.

In an aspect of the present invention a method for producing a radiation detector for ionizing radiation including a first inorganic-organic halide Perovskite material as a direct converter material and/or as a scintillator material in a detector layer is presented, comprising a seeding step of providing an seeding layer including a second inorganic-organic halide Perovskite material different from the first inorganic-organic halide Perovskite material, and a layer growth step of forming the detector layer by growing the first inorganic-organic halide Perovskite material from a solution on the seeding layer.

In a further aspect of the present invention, a radiation detector is presented for detecting ionizing radiation, comprising a detector layer, wherein the radiation detector is produced by means of the steps of the method for producing a radiation detector according to the invention.

It was found by the inventors that growing the material selectively on a seeding layer (or inoculate layer) may yield in a thick polycrystalline layer. One suitable seeding layer to grow lead Perovskite material is made of a bromide Perovskite material.

Direct converters like amorphous selenium (a-Se), lead oxide (PbO), or cadmium zinc telluride (CZT) have been previously developed for X-ray imaging or computed tomography. Such approaches are however limited in X-ray absorption and density (a-Se), availability (PbO), or have a high cost price (CZT). It is therefore desirable to have a direct converter material with high absorption at a moderate cost price, which is provided by using inorganic-organic halide Perovskite materials.

Furthermore, it is found that the inorganic-organic halide Perovskite materials need not to be provided in the form of single crystals, which allows for reductions in production costs.

It is further found that desirable properties such as high quantum efficiency, fast temporal response, high radiation resistance, thermal and chemical stability are possible.

The present inventions allows for layers that can be made quite thick with only moderate electric fields needed due to good charge mobility properties.

In a preferred embodiment, the first and second inorganic-organic halide Perovskite material consists of or comprises methyl ammonium metal halide and/or formamidinium metal halide (see Nam J. J. et al., Nature (2015) 517, 476-480, Koh T.-M. et al., J. Phys. Chem. C (2014) 118, 16458-16462).

It was found by the inventors that methyl ammonium metal halide and/or formamidinium metal halide do not only show advantageous properties in the context of photovoltaic application of Perovskite materials but may also be used in the context of radiation detectors to benefit.

In a modification of the above embodiment, the metal halide is a lead halide or a tin halide.

It is of advantage to have materials with a small band gap to increase the electron hole formation efficiency (across the bandgap). This is relevant in the context of direct detection. On the other hand, too small values for the band gap might increase undesired dark current. Thus, for direct detection, a band gap in the order to 1 to 3 eV or 1.5 to 2.5 eV appears preferable.

For scintillator applications (in which light is detected, i.e. for indirect detection), the band gap is preferred to be at least 4 eV. This can be achieved with other hybrid Perovskites. In view of the decay time of the activators, for PET application a scintillation decay time in the range of tens of nanoseconds is necessary to get the coincidence time resolution necessary for time-of-flight PET, or at least decay times in the range of hundreds of nanoseconds to determine coincident evens in standard PET. Suitable activator ions for perovskites include $Pb^{2+}$, $Eu^{2+}$, $Tl^+$, and others. Activation by ions like $Ce^{3+}$ or $Pr^{3+}$ is preferred for time-of-flight PET.

According to one aspect of the above modification, the first inorganic-organic halide Perovskite material consists of or comprises an iodide and the second inorganic-organic halide Perovskite material consists of or comprises a bromide.

In a preferable implementation of the above aspect, the solution is a mixture of a metal acetate/hydrogen iodide solution and a methylamine/hydrogen iodide solution.

It was found by the inventors that, for example, a thick $CH_3NH_3PbI_3$ Perovskite layer can advantageously be grown by first spin-coating a relatively thin $CH_3NH_3PbBr_3$ layer on, for example, a glass substrate. For growing the layer, the sample is put in a Pb(II)acetate/HI solution while adding a $CH_3NH_2$/HI solution. It was found that large crystals are formed which selectively grow on the $CH_3NH_3PbBr_3$ layer and not on the glass surface. It was further found that in this example after a few minutes the thick crystals on the substrate are already formed.

In a preferred embodiment, in the layer growth step, a light emission material is included in the detector layer, wherein the light emission material preferably includes luminescent quantum dots and/or phosphor particles.

The Perovskite material in the detector layer may absorb radiation, e.g. X-rays, and may then transfer a part of the energy to the light emission material, which will then preferably emit light having at least a wavelength outside the absorption band of the Perovskite material in the detector layer. This light emission may then be detected by a photo-detector or the like in the context of indirect detection.

In a preferred embodiment, the layer growth step is provided such that the detector layer has a thickness of 10 µm or more.

It was found by the inventors that the present invention advantageously allows for growing detector layers having a rather large thickness.

In a preferred embodiment, the method further comprises a planarizing step of providing a planarizing charge blocking layer on the detector layer.

By means of the planarizing layers, an unevenness or roughness of the surface of the detector layer is equalized to a certain extent, such that the distance between the electrode(s) formed on the charge blocking layer to the electrode(s) provided between the detector layer and the substrate is made more even, thus avoiding undesired effects on the distribution or forming of an electric field between the electrode.

In a preferred embodiment, the method further comprises a provision step of providing a structure of the seeding layer by localized deposition of the second inorganic-organic halide Perovskite material, preferably by inkjet, slot-die and/or screen printing.

The localized deposition allows for an increased control of the growing process.

In a modification of the above embodiment, the method further comprises a roughening step of roughening a surface of a substrate on which the seeding layer is to be deposited, prior to the provision step.

The roughening of the surface provides better conditions for the seeding layer to adhere or "stick" to the substrate.

In a preferred embodiment, the radiation detector comprises a substrate, a structured plurality of bottom electrodes, the detector layer and a top electrode in this order, wherein on each of the bottom electrodes a portion of the seeding layer is provided.

The arrangement of bottom electrodes, detector layer and top electrodes allows for a direct detection of the radiation in that the radiation is detected from the generation of charge carriers caused by the impact of the radiation in the detector layer.

Alternatively, the radiation detector includes a structured plurality of electrodes and the detector layer in this order, wherein on each of the electrodes a portion of the seeding layer is provided and the electrodes include anodes and cathodes; thus providing for a lateral build-up of the diode arrangement.

In a lateral build-up of a photoconducting device two electrodes are placed underneath the photo conducting material, while optionally also in interdigitate 'finger' structures are provided. The current flow is thus lateral instead of vertical. Connecting both electrodes in a pixelated device may be more complicated, but advantages are seen in fabrication, in particular as there are less interfaces to manage.

It is additionally noted that one can modify the workfunctions involved here. In particular, adapting may be provided by doped electrodes for instance. Work function differences may be obtained with different metals, while also monolayers may be provided that change the workfunction of a metal. This also applies to the use of ferroelectric polymers, doped layers, etc.

In a modification of the above embodiments, the radiation detector comprises a charge blocking layer between the bottom electrodes and the detector layer, between the anodes and cathode electrodes and the detector layer and/or a charge blocking layer and/or a conducting layer between the detector layer and the top electrode. Regarding the charge blocking layers, it will be appreciated that it depends, for example, on the polarity of the bias voltage which kind of charge (hole or electron) should be transported or blocked. While the charge blocking layers are provided to control transport or blocking of charge carriers between the detector material and the electrode(s), the conducting layer may be provided to reduce or even prevent short of the top electrode towards the substrate.

In a further, additional or alternative, modification of the above embodiment, the radiation detector further comprises a plurality of photo detectors arranged so to sandwich the bottom electrodes or the anode and cathode electrodes with the detector material, wherein the photo detectors are configured to detect a light emission of the detector material caused by an incident radiation.

It is possible to combine the approaches of direct detection (via charge carriers) and indirect detection (via photo detectors arranged to detect scintillation light) in the context of the present invention. It is beneficial to combine the use of direct conversion and scintillation if both are available in one detector material. A particular advantage may be expected if a part of the X-ray energy, which is converted into light, is used for a time stamp in PET imaging, while (at least some portion of) the other part in direct conversion is used to get a high signal (in number of electrons or holes) and therefore good energy resolution.

Scintillation-based detectors (indirect detectors) as such are inferior to direct conversion detectors in spatial resolution due to light spread. Usually the efficiency of energy conversion is also lower than in direct conversion detectors. Conventionally used direct conversion detector materials have limitations in absorption efficiency for higher energy X-ray, need very thick layers with high voltages applied to ensure good charge collection efficiency, and show temporal artifacts in imaging with high frame repetition rates. They are therefore most suited for mammography (approx. 20 keV photon energy) but not for higher photon energies. Moreover the layers are produced in complex vacuum evaporation processes or expensive single crystal growth (CZT).

It was found that inorganic-organic halide perovskites can be used at higher photon energies, used e.g. in Computed Tomography (CT) applications. They can also emit (infrared) light. That makes the materials also usable in a combined direct/indirect detector, in which in addition to the direct signal obtained with high spatial resolution from the photocurrent also an indirect signal may be obtained with high time resolution by detecting the emitted (infra-red) light using a photo-detector.

The radiation detectors of the present invention can include a multilayer structure of different active inorganic, organic or hybrid materials or mixtures of these materials including top and bottom electrodes (like e.g. metals, transparent conductive oxides), (charge carrier) transport and blocking layers.

The devices can be structured into pixels either by the electrodes or in the conversion material itself. The devices can have any shape and size.

It shall be understood that the method of claim 1 and the radiation detector of claim 12 have similar and/or identical preferred embodiments, in particular, as defined in the dependent claims.

It shall be understood that a preferred embodiment of the invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
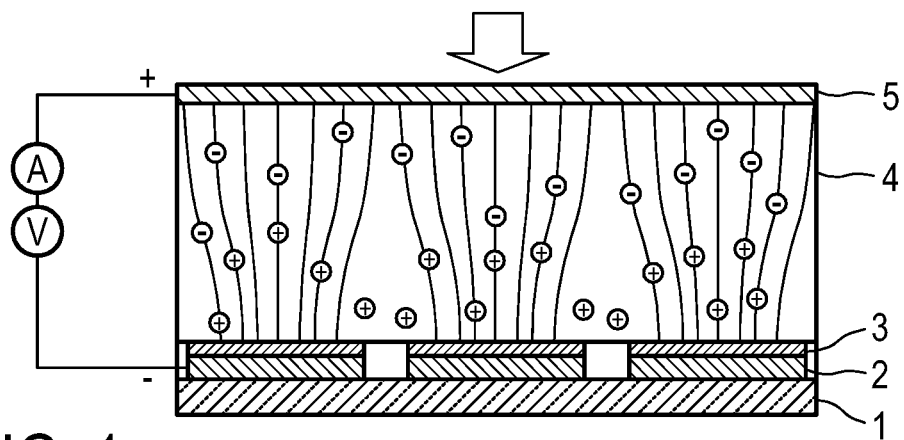
FIG. 1 shows a schematic partial diagram of a radiation detector in accordance with an embodiment of the invention.

FIG. 1 shows a schematic diagram of a radiation detector in accordance with an embodiment of the invention.

The basic structure includes a substrate 1 with structured bottom electrodes 2 on it. On top of the bottom electrode 2 an electron blocking layer (not shown) might be present. On top of the arrangement of substrate 1 and bottom electrodes 2 a halide Perovskite layer 4 is placed, with a seeding layer 3 provided on the bottom electrodes 2. This layer 4 might be thin (100 nm-100 μm) for mammography, thicker (100-2000 μm) for general X-ray and CT and quite thick (1-20 mm) for SPECT or PET.

On top of layer 4 a hole blocking layer might (not shown) be present. Also might there be a conducting layer (not shown) to reduce/prevent shorts of a top electrode 5 towards the substrate 1.

On top of the above mentioned layers, the top electrode 5 is deposited. The top electrode 5 might contain an electron injection layer (not shown).

Preferably the total structure is a diode. This can be achieved by having different work functions between the bottom and the top electrodes 2, 5.

The voltage applied on the total stack of layers should preferably put the diode in blocking mode to reduce dark current and increase the sensitivity and timing performance.

An advantage of the inorganic-organic halide Perovskite materials is that the energy gap and the mobility can be easily adjusted by varying the metals, halogen atoms and/or the organic groups as well as layer morphologies and multilayer device structures.

The stack of layers shown in FIG. 1 may be part of an imaging detector which consists of multiple pixels. The formation of the pixels can be done only at one or multiple parts of the layer stack, wherein, for example, the X-ray absorption layer (Perovskite material) can be segmented with gaps or isolating layers in between the pixels, and/or on a continuous absorption layer one or both electrodes can be segmented.

The arrow at the top of the figure symbolized the incident radiation, while furthermore the electric field between the electrodes 2, 5 is indicated schematically, together with generated charges (electrons and holes).

Figure 2:
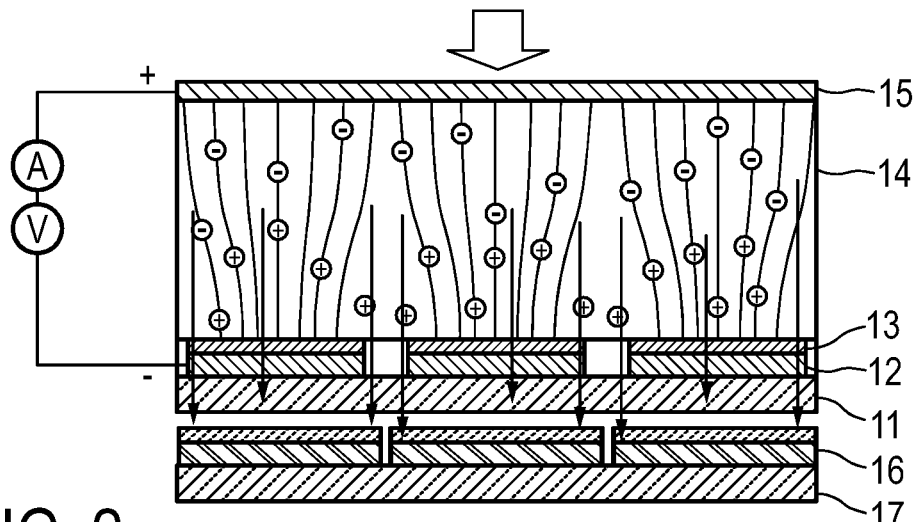
FIG. 2 shows a schematic partial diagram of a radiation detector in accordance with another embodiment of the invention.

FIG. 2 shows a schematic partial diagram of a radiation detector in accordance with another embodiment of the invention.

According to the present invention, the Perovskite material(s) may be used also as light emitter to detect with good time resolution the signal with an extra photodetector and to measure the X-ray signal with good spatial resolution using the Perovskite material(s) as a direct conversion photoconductor. For time resolution the photodetector is preferably a sufficiently fast photodetector. It is also possible to use a silicon photo-multiplier (SiPM).

The arrangement of substrate 11, bottom electrode 12, seeding layer 13, Perovskite layer 14 and top electrode 15 basically corresponds to the corresponding arrangement shown in FIG. 1.

Additionally, elements 16 for detection of the light emission (illustrated by the smaller arrows from the Perovskite layer 14 downwards) are placed below the electrodes 12 for the direct conversion detection (i.e. electrodes 12 are used for direct conversion, while elements 16 are for scintillation light detection). In this case a (semi-)transparent electrode material is used for electrodes 12. The photo-detectors 16 placed on a base 17 are optimized to operate for the wavelength emitted by the conversion material in this mode. For, for example, $CH_3NH_3PbI_3$ this would be in the infra-red part of the electromagnetic (EM) spectrum. The light absorption of the conversion material should preferably be mainly at other parts of the EM spectrum in such case to avoid self-absorption of the light emitted.

In the present embodiment, the photo-detectors 16 are larger than the electrodes 12 in order to measure the emitted light with high geometrical fill factor.

Figure 3:
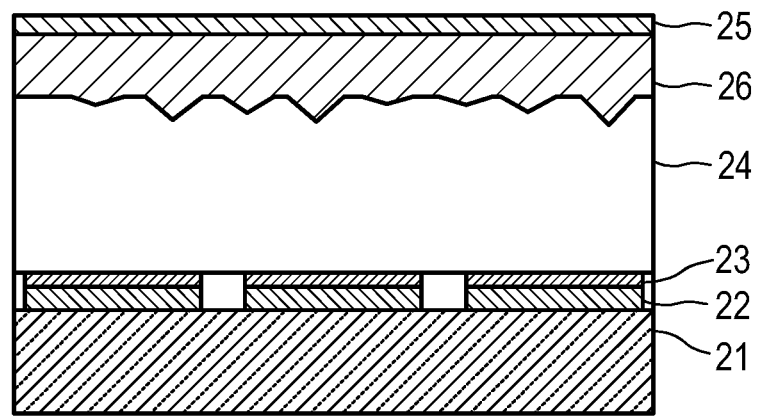
FIG. 3 shows a further schematic partial diagram illustrating a layer structure in accordance with a further embodiment of the invention.

Deviation from the illustration of FIG. 3, the photo-detectors may be large detection elements that are common for a number of bottom electrodes. This allows getting the time stamp of the scintillation light, while the corresponding charge would be detected with high spatial resolution on electrodes 12.

FIG. 3 shows a further schematic partial diagram illustrating a layer structure in accordance with a further embodiment of the invention, which is quite similar to the structure illustrated in FIG. 1 and FIG. 2.

By not providing a top electrode as shown in FIGS. 1 to 3 and appropriately providing sub-sets of the electrodes 2, 12, 22 as anodes and cathodes, respectively, a laterally built-up diode may be provided.

A thick $CH_3NH_3PbI_3$ Perovskite layer 24 can be grown by first providing a relatively thin $CH_3NH_3PbBr_3$ layer 23 in a structured manner (e.g. by inkjet) on a glass substrate 21 on which bottom electrodes 22 are provided (it is also possible to provide the seeding layer 23 is an unstructured manner, e.g. by spin-coating). Then the sample is put in a Pb(II) acetate/HI solution (15 g Pb(II)acetate/60 ml concentrated (57% by weight) aqueous HI) at 100° C. while adding a $CH_3NH_2$/HI solution (100° C.; 3.58 g $CH_3NH_2$ (40% in water)/12 ml HI). Large crystals are formed which selectively grow on the $CH_3NH_3PbBr_3$ layer and not on the glass surface. In conventional situations, usually a slow crystal growth is applied standardly. In the context of the present invention, however, it was found that after a few minutes the thick crystals on the substrate are already formed.

Between the $CH_3NH_3PbI_3$ layer 24 and the top electrode 25, a planarizing electron injection layer 26 (an example of a charge blocking layer) is provided.

Also the structures of FIG. 1 and FIG. 2 include the seeding layers 3 and 13, respectively, in correspondence to the $CH_3NH_3PbBr_3$ layer 23.

Figure 4:
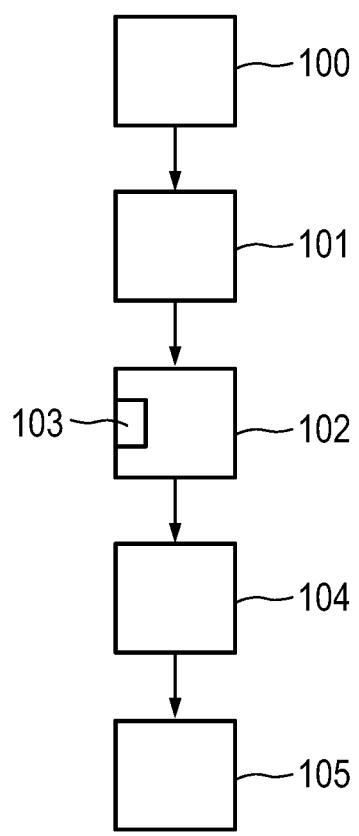
FIG. 4 shows a flow diagram illustrating step of the method according to an embodiment of the invention.

FIG. 4 shows a flow diagram illustrating step of the method according to an embodiment of the invention.

After providing a substrate with bottom electrodes, desired portions thereof are roughened in roughening step 100 in order to enhance the contact stability between the deposited $CH_3NH_3PbBr_3$ layer.

The in following seeding step 101, a $CH_3NH_3PbBr_3$ layer is provided as a seeding layer.

After the seeding step 101, a layer growth step 102 is provided, in which the detector layer including $CH_3NH_3PbI_3$ as inorganic-organic halide Perovskite material is provided, as discussed above. The layer growth step includes in this case an inclusion sub-step 103 of including a light emission material in the detector layer.

The provision of the detector layer in the layer growth step 102 is followed by a planarizing step 104, in which a planarizing layer in form of a charge blocking layer is provided.

This is followed by a completion step 105 in which further steps for completing the radiation detector are included. Additional discussion thereof is not needed, as the skilled person is sufficiently familiar with such further steps.

In addition to the steps shown in FIG. 4, the radiation detector may be provided with photo detectors (see FIG. 2), in order to provide a combined direct and indirect detection.

While the invention has been illustrated and described in detail in the drawings and foregoing description, such illustration and description are to be considered illustrative or exemplary and not restrictive; the invention is not limited to the disclosed embodiments.

Additional (light) emitter materials may be incorporated and distributed in the active Perovskite layer(s). The Perovskite material may absorb X-ray and may transfer part of the absorbed energy to the additional emitter material. This emitter material might then emit the light preferably having a wavelength outside of the absorption band of the Perovskite material(s). This light can then be detected by a photo-detector.

It is possible and contemplated to stack two or more different Perovskite materials on top of each other with (an) electrode(s) between the materials. Then two or more different X-ray energies might be detected by the difference in response/sensitivity of the materials. This is of particular interest for applications in spectral CT.

The present invention includes the use of methyl ammonium lead halide Perovskites $(CH_3NH_3Pb(I/Br/Cl)_3)$ as a semiconductor photo-detector material.

Lead-free detectors may be provided by replacing the Pb components by Sn in the Perovskites materials $(CH_3NH_3Sn(I/Br/Cl)_3)$. The resulting detector has less environmental issues than one including Pb.

It is possible to structure the growth of the Perovskite material(s) by locally depositing by e.g. inkjet of the thin layer of, for example, $CH_3NH_3PbBr_3$ on an oxidic/metallic conductor on which, for example, $CH_3NH_3PbI_3$ would not grow by itself to a satisfactory amount. To enhance the sticking of the $CH_3NH_3PbBr_3$ layer, a surface roughening might be provided. In addition or in alternative to this, another approach may include selectively depositing a non-sticking layer like $SiO_2$ to achieve or enhance selective growth of, for example, the $CH_3NH_3PbI_3$.

The present invention may be implemented also by using organic substrates. If the organic layers are not conductive, this crystal growth is then more suited for scintillators.

The present invention may particularly be employed to benefit in the areas of mammography, CT, PET scanners (including multimodal), nuclear medicine (planar cameras, SPECT), safety (e.g. nuclear plants and environment), security, particle and high energy physics, non-destructive inspection, astrophysics and hunting for (mineral) resources, even though this list in not exhaustive.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single processor, device or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A method for producing a radiation detector for ionizing radiation, comprising:
   including a first inorganic-organic halide Perovskite material as a direct converter material and/or as a scintillator material in a detector layer;
   providing a seeding layer including a second inorganic-organic halide Perovskite material different from the first inorganic-organic halide Perovskite material; and
   forming the detector layer by growing the first inorganic-organic halide Perovskite material from a solution on the seeding layer.

2. The method according to claim 1, wherein the first and second inorganic-organic halide Perovskite materials comprise methyl ammonium metal halide and/or formamidinium metal halide.

3. The method according to claim 2, wherein the metal halide is a lead halide or a tin halide.

4. The method according to claim 1, wherein the first inorganic-organic halide Perovskite material comprises an iodide, and the second inorganic-organic halide Perovskite material comprises a bromide.

5. The method according to claim 1, wherein the solution is a mixture of a metal acetate/hydrogen iodide solution and a methylamine/hydrogen iodide solution.

6. The method according to claim 1, further comprising including a light emission material in the detector layer.

7. The method according to claim 6, wherein the light emission material includes luminescent quantum dots and/or phosphor particles.

8. The method according to claim 1, wherein the detector layer has a thickness of 10 μm or more.

9. The method according to claim 1, further comprising providing a planarizing charge blocking layer on the detector layer.

10. The method according to claim 1, further comprising providing a structure of the seeding layer by localized deposition of the second inorganic-organic halide Perovskite material by inkjet, slot-die and/or screen printing.

11. The method according to claim 10, further comprising roughening a surface of a substrate on which the seeding layer is to be deposited.

12. A radiation detector for detecting ionizing radiation, comprising a detector layer, and a seeding layer including a second inorganic-organic halide Perovskite material different from a first inorganic-organic halide Perovskite material, and the detector layer is formed by growing the first inorganic-organic halide Perovskite material from a solution on the seeding layer.

13. The radiation detector according to claim 12, comprising:
   a substrate, a structured plurality of bottom electrodes, the detector layer and a top electrode, wherein on each of the bottom electrodes a portion of the seeding layer is provided, or
   a substrate, a structured plurality of electrodes and the detector layer, wherein on each of the electrodes a portion of the seeding layer is provided and the electrodes include anodes and cathodes.

14. The radiation detector according to claim 13, comprising a charge blocking layer between the bottom electrodes and the detector layer, between the anodes and cathodes and the detector layer and/or a charge blocking layer and/or a conducting layer between the detector layer and the top electrode.

15. The radiation detector according to claim 13, further comprising a plurality of photo detectors configured to sandwich the bottom electrodes or the anodes and cathodes with the detector material, wherein the photo detectors are configured to detect a light emission of the detector material caused by an incident radiation.

* * * * *